(12) United States Patent
Murata et al.

(10) Patent No.: US 10,658,324 B2
(45) Date of Patent: May 19, 2020

(54) SEMICONDUCTOR DEVICE

(71) Applicant: Mitsubishi Electric Corporation, Tokyo (JP)

(72) Inventors: Daisuke Murata, Tokyo (JP); Yuji Imoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/107,966

(22) Filed: Aug. 21, 2018

(65) Prior Publication Data

US 2018/0358319 A1 Dec. 13, 2018

Related U.S. Application Data

(62) Division of application No. 15/173,742, filed on Jun. 6, 2016, now abandoned.

(30) Foreign Application Priority Data

Oct. 9, 2015 (JP) .................................. 2015-201381

(51) Int. Cl.
*H01L 23/00* (2006.01)
*H01L 23/492* (2006.01)
(Continued)

(52) U.S. Cl.
CPC ............ *H01L 24/29* (2013.01); *H01L 23/492* (2013.01); *H01L 23/498* (2013.01); *H01L 24/27* (2013.01); *H01L 24/30* (2013.01); *H01L 24/32* (2013.01); *H01L 23/3107* (2013.01); *H01L 23/3121* (2013.01); *H01L 23/562* (2013.01); *H01L 24/33* (2013.01); *H01L 24/40* (2013.01);
(Continued)

(58) Field of Classification Search
CPC . H01L 25/042; H01L 25/0655; H01L 25/072; H01L 25/0753; H01L 25/115
See application file for complete search history.

(56) References Cited

U.S. PATENT DOCUMENTS 4,710,795 A * 12/1987 Nippert ............. H01L 23/49844
257/692
5,276,586 A * 1/1994 Hatsuda ................ H01L 23/433
165/185
(Continued)

FOREIGN PATENT DOCUMENTS

| CN | 101179066 A | 5/2008 |
| CN | 104064476 A | 9/2014 |

(Continued)

OTHER PUBLICATIONS

An Office Action mailed by the Japanese Patent Office dated Jul. 31, 2018, which corresponds to Japanese Patent Application No. 2015-201381.
(Continued)

*Primary Examiner* — David A Zarneke
(74) *Attorney, Agent, or Firm* — Studebaker & Brackett PC

(57) ABSTRACT

A semiconductor device includes: an insulating substrate; an aluminum pattern made of a pure aluminum or alloy aluminum material and formed on the insulating substrate; a plating formed on a surface of the aluminum pattern; and a semiconductor element joined to the plating, wherein a thickness of the plating is 10 μm or more.

5 Claims, 10 Drawing Sheets

(51) Int. Cl.
*H01L 23/498* (2006.01)
*H01L 23/31* (2006.01)
*H01L 25/07* (2006.01)

(52) U.S. Cl.
CPC .............. *H01L 24/83* (2013.01); *H01L 24/84* (2013.01); *H01L 25/072* (2013.01); *H01L 2224/27013* (2013.01); *H01L 2224/2746* (2013.01); *H01L 2224/29082* (2013.01); *H01L 2224/29101* (2013.01); *H01L 2224/29144* (2013.01); *H01L 2224/29155* (2013.01); *H01L 2224/3003* (2013.01); *H01L 2224/32245* (2013.01); *H01L 2224/33* (2013.01); *H01L 2224/33181* (2013.01); *H01L 2224/37099* (2013.01); *H01L 2224/40137* (2013.01); *H01L 2224/83385* (2013.01); *H01L 2224/83444* (2013.01); *H01L 2224/83801* (2013.01); *H01L 2224/84801* (2013.01); *H01L 2924/00014* (2013.01); *H01L 2924/014* (2013.01); *H01L 2924/1033* (2013.01); *H01L 2924/10254* (2013.01); *H01L 2924/10272* (2013.01); *H01L 2924/1203* (2013.01); *H01L 2924/13055* (2013.01); *H01L 2924/15724* (2013.01); *H01L 2924/181* (2013.01); *H01L 2924/18301* (2013.01); *H01L 2924/3656* (2013.01)

(56) References Cited

U.S. PATENT DOCUMENTS

| | | | | |
|---|---|---|---|---|
| 5,623,394 | A * | 4/1997 | Sherif | H01L 23/3737 165/185 |
| 5,757,620 | A * | 5/1998 | Edwards | H01L 23/42 165/185 |
| 6,703,707 | B1 * | 3/2004 | Mamitsu | H01L 23/051 257/718 |
| 7,023,699 | B2 * | 4/2006 | Glovatsky | H05K 7/20454 165/185 |
| 7,193,318 | B2 * | 3/2007 | Colgan | H01L 25/0655 257/713 |
| 7,535,092 | B2 * | 5/2009 | Yokozuka | H01L 24/29 257/688 |
| 7,547,966 | B2 * | 6/2009 | Funakoshi | H01L 23/051 257/706 |
| 8,941,208 | B2 * | 1/2015 | Chauhan | H01L 23/3128 257/506 |
| 9,184,124 | B2 * | 11/2015 | Chauhan | H01L 23/3128 |
| 9,443,792 | B1 * | 9/2016 | Spann | H01L 24/48 |
| 9,640,461 | B1 * | 5/2017 | Spann | H01L 24/48 |
| 9,704,788 | B2 * | 7/2017 | Gowda | H01L 23/3677 |
| 9,953,913 | B1 * | 4/2018 | Gowda | H01L 23/3121 |
| 9,953,917 | B1 * | 4/2018 | Gowda | H01L 21/486 |
| 9,960,145 | B2 * | 5/2018 | Costa | H01L 23/3135 |
| 10,032,689 | B2 * | 7/2018 | Jeon | H01L 23/3675 |
| 10,163,858 | B1 * | 12/2018 | Liu | H01L 24/83 |
| 10,163,860 | B2 * | 12/2018 | Hsu | H01L 25/0657 |
| 2004/0144561 | A1 | 7/2004 | Osanai et al. | |
| 2009/0116197 | A1 * | 5/2009 | Funakoshi | H01L 21/4882 361/719 |
| 2009/0229864 | A1 | 9/2009 | Kuromitsu et al. | |
| 2010/0109016 | A1 | 5/2010 | Yagi et al. | |
| 2013/0057361 | A1 | 3/2013 | Sakano et al. | |
| 2014/0021620 | A1 | 1/2014 | Lee et al. | |
| 2014/0029234 | A1 * | 1/2014 | Chauhan | H01L 23/3128 361/820 |
| 2014/0054757 | A1 | 2/2014 | Ikuta et al. | |
| 2014/0117508 | A1 * | 5/2014 | Nishi | H01L 23/3735 257/622 |
| 2014/0284797 | A1 | 9/2014 | Hisazato et al. | |
| 2015/0208496 | A1 | 7/2015 | Terasaki et al. | |
| 2015/0319876 | A1 | 11/2015 | Ohashi et al. | |
| 2016/0190085 | A1 | 6/2016 | Kato | |
| 2016/0300809 | A1 | 10/2016 | Miyazaki et al. | |
| 2017/0200687 | A1 | 7/2017 | Chen et al. | |

FOREIGN PATENT DOCUMENTS

| | | |
|---|---|---|
| JP | Hei7-122678 A | 5/1995 |
| JP | 2004-119944 A | 4/2004 |
| JP | 2004-146512 A | 5/2004 |
| JP | 2004-214284 A | 7/2004 |
| JP | 2005-183448 A | 7/2005 |
| JP | 2005-243819 A | 9/2005 |
| JP | 2009-087964 A | 4/2009 |
| JP | 2010-251457 A | 4/2010 |
| JP | 2013-191640 A | 9/2013 |
| JP | 2014-143407 A | 8/2014 |
| JP | 2014-187088 A | 10/2014 |
| JP | 2014-216459 A | 11/2014 |
| WO | 2011/138817 A1 | 11/2011 |

OTHER PUBLICATIONS

An Office Action mailed by the State Intellectual Property Office of the People's Republic of China dated Jan. 14, 2019, which corresponds to Chinese Patent Application No. 201610881663.8 and is related to U.S. Appl. No. 16/107,966.

An Office Action mailed by the State Intellectual Property Office of the People's Republic of China dated Oct. 8, 2019, which corresponds to Chinese Patent Application No. 201610881663.8 and is related to U.S. Appl. No. 16/107,966; with English language translation.

An Office Action mailed by the German Patent Office dated Jan. 7, 2020, which corresponds to German Patent Application No. 102016214155.4 and is related to U.S. Appl. No. 16/107,966; with English language translation.

An Office Action issued by the State Intellectual Property Office of the People's Republic of China dated Mar. 13, 2020, which corresponds to Chinese Patent Application No. CN201610881663.8.

* cited by examiner

SEMICONDUCTOR DEVICE

CROSS-REFERENCE TO RELATED APPLICATIONS

This application is a Divisional Application of U.S. patent application Ser. No. 15/173,742 filed Jun. 6, 2016, which claims benefit of Japanese Patent Application No. 2015-201381, filed on Oct. 9, 2015, the entire contents of which are incorporated herein by reference.

BACKGROUND OF THE INVENTION

Field

The present invention relates to a semiconductor device in which plating is formed on a surface of an aluminum pattern on an insulating substrate and a semiconductor element is joined to the plating.

Background

In automobiles or trains powered by electric motors, semiconductor devices are used as inverters or regenerative converters that control the motors. In such semiconductor devices, plating is formed on a surface of an aluminum pattern on an insulating substrate and a semiconductor element is bonded to the plating. In conventional semiconductor devices, it is believed that a plating thickness necessary for joining is a minimum on the order of 3 to 5 μm and the plating thickness is preferably small for reasons related to thermal resistance or the like (e.g., see JP 7-122678 A).

When a semiconductor element starts operating and generating heat, thus producing temperature swing, thermal stress is generated since there is a large difference in a coefficient of linear expansion between the aluminum pattern and the insulating substrate. Therefore, the aluminum pattern susceptible to plastic deformation becomes deformed due to the thermal stress. In the case of the conventional plating thickness on the order of 3 to 5 μm, the influence of this deformation is transmitted to the semiconductor element via the plating and solder, and the semiconductor element also becomes deformed. This may cause characteristic variations of the semiconductor element, which may even lead to destruction of the semiconductor element. Special measures may be required since stress applied to the element increases as the semiconductor element becomes thinner.

SUMMARY

The present invention has been implemented to solve the above-described problems and it is an object of the present invention to provide a semiconductor device capable of preventing characteristic variations and improving reliability.

According to the present invention, a semiconductor device includes: an insulating substrate; an aluminum pattern made of a pure aluminum or alloy aluminum material and formed on the insulating substrate; a plating formed on a surface of the aluminum pattern; and a semiconductor element joined to the plating, wherein a thickness of the plating is 10 μm or more.

In the present invention, the thicknesses of the plating is assumed to be 10 μm or more. This makes it less likely for the semiconductor element to be affected by the aluminum pattern deformed due to thermal stress. Therefore, it is possible to prevent characteristic variations due to the deformation of the semiconductor element and improve reliability (power cycle life) against destruction of the semiconductor element.

Other and further objects, features and advantages of the invention will appear more fully from the following description.

DESCRIPTION OF EMBODIMENTS

A semiconductor device according to the embodiments of the present invention will be described with reference to the drawings. The same components will be denoted by the same symbols, and the repeated description thereof may be omitted.

First Embodiment

Figure 1:
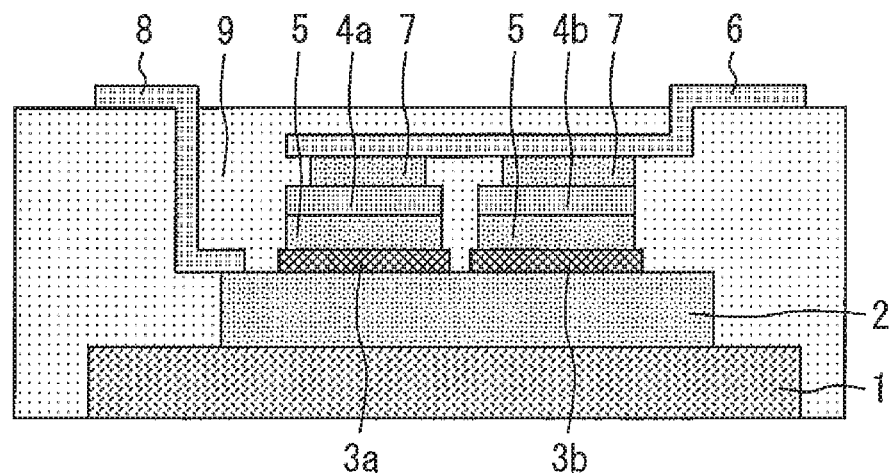
FIG. 1 is a cross-sectional view illustrating a semiconductor device according to a first embodiment of the present invention.

FIG. 1 is a cross-sectional view illustrating a semiconductor device according to a first embodiment of the present invention. An aluminum pattern 2 made of a pure aluminum or alloy aluminum material is formed on an insulating substrate 1. Platings 3a and 3b are formed on a surface of the aluminum pattern 2. The platings 3a and 3b are arranged side by side. The platings 3a and 3b are nickel platings and have a thickness of 10 μm or more.

Semiconductor elements 4a and 4b are joined to the platings 3a and 3b respectively via solder 5. An electrode 6 is joined to top surfaces of the semiconductor elements 4a and 4b via solder 7. The solder 5 and the solder 7 may be of the same composition or different compositions. An electrode 8 is joined to the aluminum pattern 2. The whole this part is sealed with a sealing material 9 such as resin.

Figure 2:
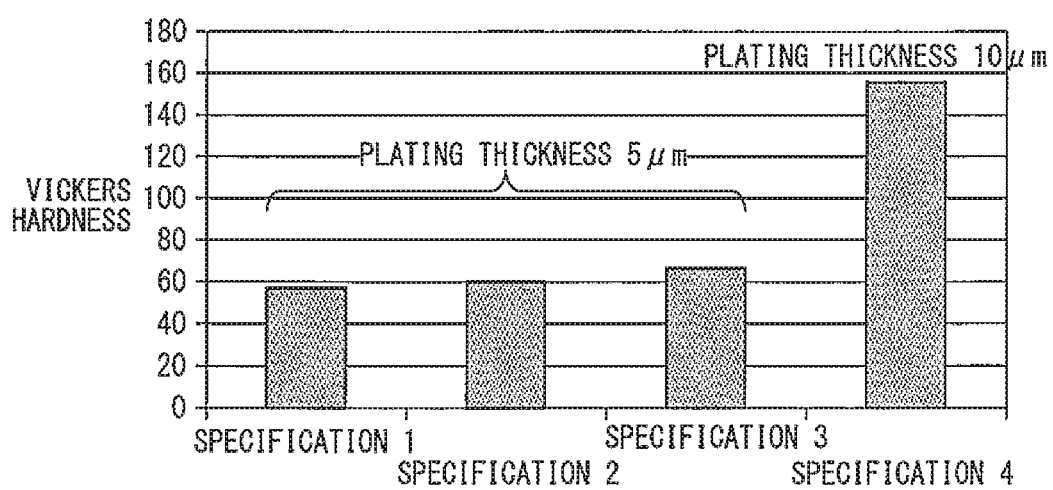
FIG. 2 is a diagram illustrating results of measuring hardness of plating.

FIG. 2 is a diagram illustrating results of measuring hardness of plating. Table 1 also shows the measurement results. Indentation depths are expressed in numerical values of an apparatus laser detector.

TABLE 1

| Sample | Test load | Length of diagonal (μm) | Indentation depth (μm) | Hardness (HV) |
|---|---|---|---|---|
| Specification 1 | 50 g | 40 | 7 | 58.2 |
| Specification 2 | 50 g | 39 | 7.5 | 60.0 |
| Specification 3 | 50 g | 36.5 | 6.7 | 67.3 |
| Specification 4 | 50 g | 25 | 4 | 155.6 |

When the plating thickness is assumed to be 10 μm, no superiority is observed in a degree of adhesion to the aluminum pattern compared to a case where the plating thickness is 5 μm and both cases correspond to a fracture mode of the plated part. Moreover, Vickers hardness of the plating surface depends on physical properties of nickel and is not affected by the thickness, and therefore even when the plating thickness is set to 10 μm, no superiority is observed. On the other hand, when the plating thickness is assumed to be 10 μm, apparent Vickers hardness including the aluminum pattern becomes approximately 2.5 times. Therefore, it is considered that deformation of plating and deformation of the aluminum pattern can be suppressed by increasing the plating thickness.

Figure 3:
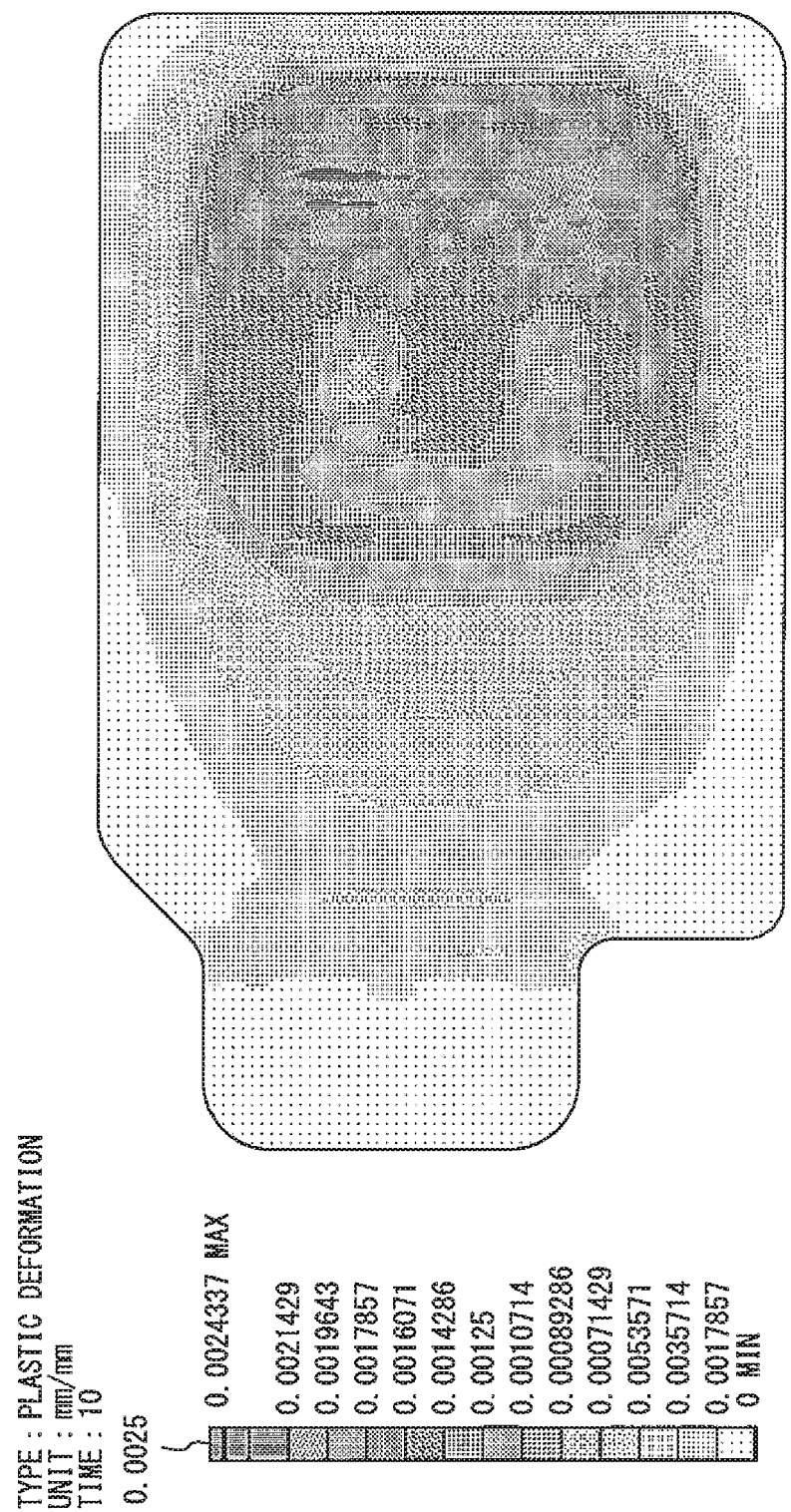
FIG. 3 is a diagram illustrating plastic deformation of the aluminum pattern having a conventional plating thickness.
Figure 4:
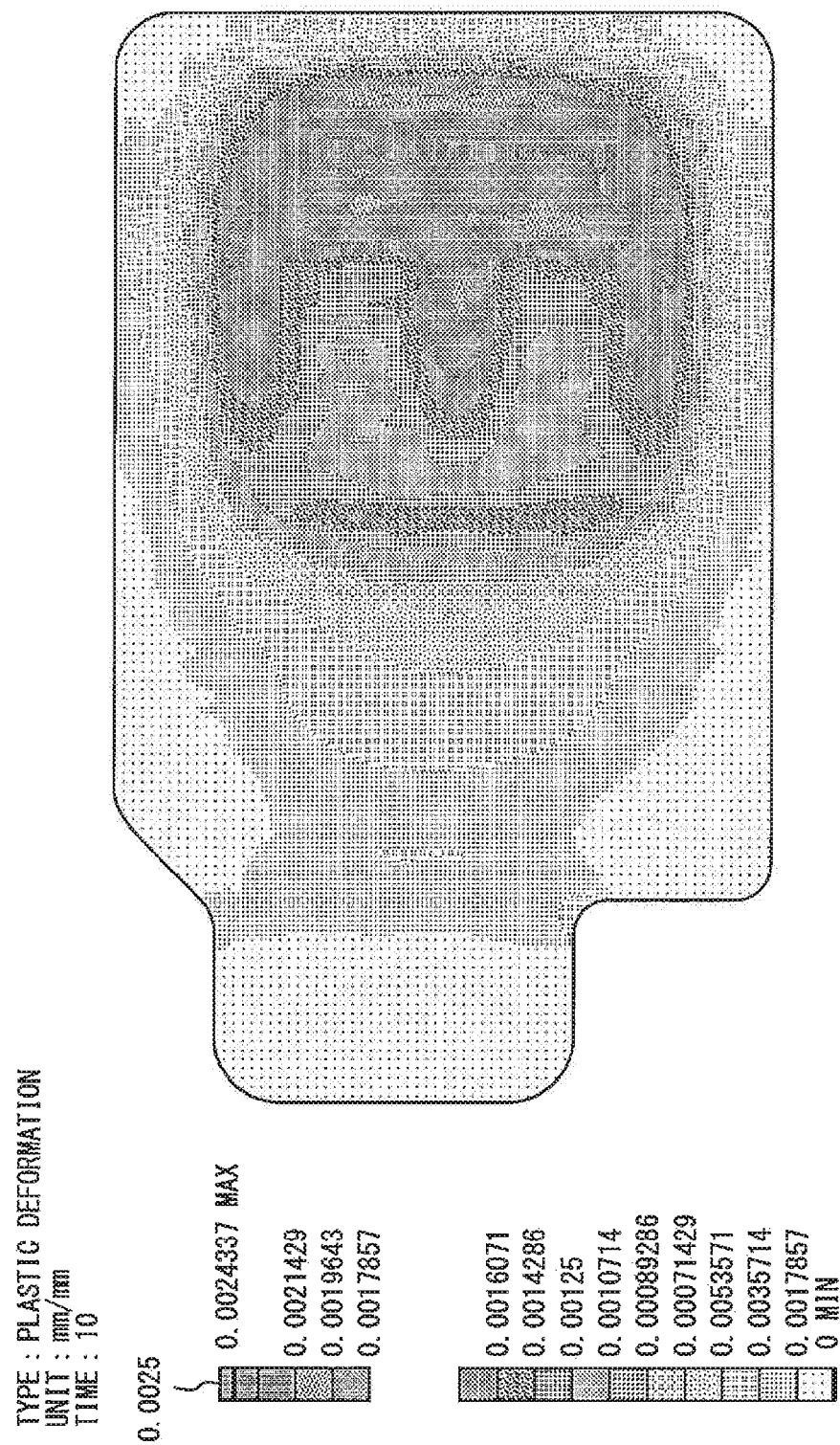
FIG. 4 is a diagram illustrating plastic deformation of the aluminum pattern having a plating thickness of 10 μm.

FIG. 3 is a diagram illustrating plastic deformation of the aluminum pattern having a conventional plating thickness. FIG. 4 is a diagram illustrating plastic deformation of the aluminum pattern having a plating thickness of 10 μm. Both are analysis results of simulation of plastic deformation five power cycles later. By setting the plating thickness to 10 μm, it is possible to suppress plastic deformation of the aluminum pattern and move a maximum point from a central part to an outside of the semiconductor element. Furthermore, plastic deformation of the plating itself is suppressed and propagation of deformation of the aluminum pattern to the semiconductor element is suppressed.

Figure 5:
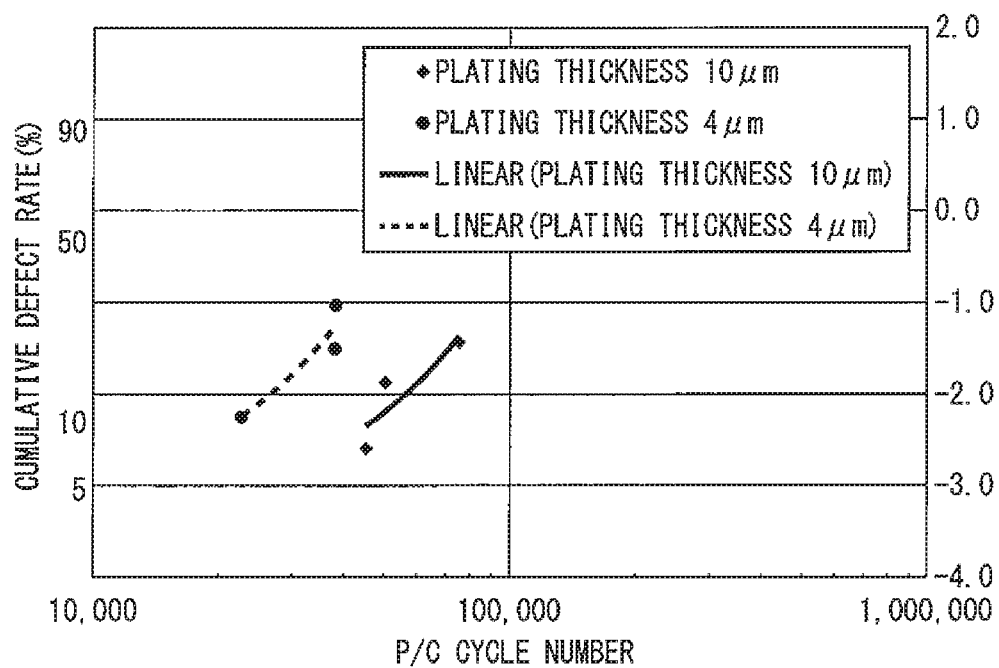
FIG. 5 is a diagram illustrating a cumulative defect rate vs a power cycle number.

FIG. 5 is a diagram illustrating a cumulative defect rate vs a power cycle number. It is observed that a power cycle life improves when the plating thickness is 10 μm compared to when the plating thickness is 4 μm.

As described above, in the present embodiment, the thicknesses of the platings 3a and 3b are assumed to be 10 μm or more. This makes it less likely for the semiconductor elements 4a and 4b to be affected by the aluminum pattern 2 deformed due to thermal stress. Therefore, it is possible to prevent characteristic variations due to the deformation of the semiconductor elements 4a and 4b and improve reliability (power cycle life) against destruction of the semiconductor elements 4a and 4b.

The surface of the aluminum pattern 2 is preferably subjected to total or partial work hardening through shot peening or the like. This suppresses the deformation of the aluminum pattern 2 itself, and can thereby amplify the effect of the platings 3a and 3b.

Second Embodiment

Figure 6:
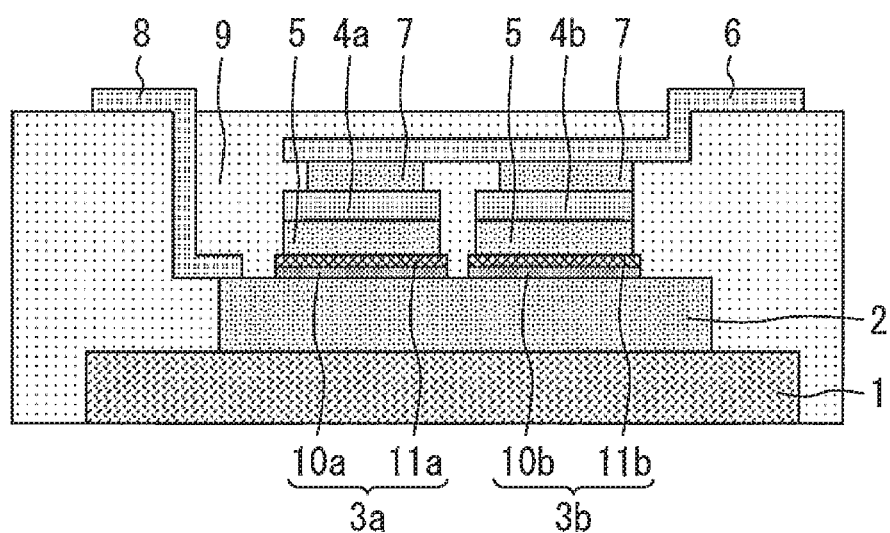
FIG. 6 is a cross-sectional view illustrating a semiconductor device according to a second embodiment of the present invention.

FIG. 6 is a cross-sectional view illustrating a semiconductor device according to a second embodiment of the present invention. In the present embodiment, the plating 3a is a multilayered film including a lower layer film 10a and an upper layer film 11a formed on the lower layer film 10a. Similarly, the plating 3b is a multilayered film including a lower layer film 10b and an upper layer film 11b formed on the lower layer film 10b. The lower layer films 10a and 10b are made of nickel or the like which has higher rigidity and less likely to become deformed than the upper layer films 11a and 11b. The upper layer films 11a and 11b are made of gold or the like having higher wettability with respect to the solder 5 than the lower layer films 10a and 10b. This makes it possible to keep strength, improve reliability while improving wettability of the solder 5 and reducing voids as well, and thereby also improve assemblability.

Third Embodiment

Figure 7:
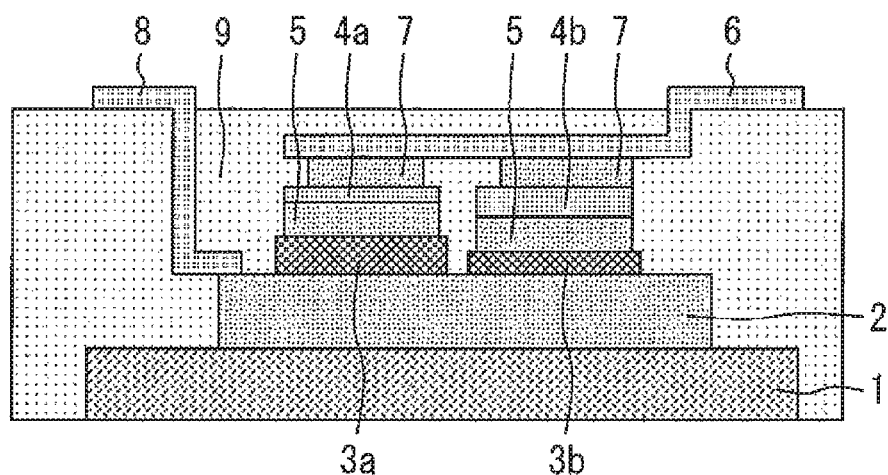
FIG. 7 is a cross-sectional view illustrating a semiconductor device according to a third embodiment of the present invention.

FIG. 7 is a cross-sectional view illustrating a semiconductor device according to a third embodiment of the present invention. In the present embodiment, a semiconductor element 4a is thinner than a semiconductor element 4b. Thus, the plating 3a is made to be thicker than the plating 3b. In this way, when the semiconductor elements 4a and 4b having different thicknesses such as an IGBT and a diode are mounted, it is possible to cause the top surfaces of the semiconductor elements 4a and 4b to have the same height without adjusting the thickness of the solder 5. This makes joining of electrodes to the semiconductor elements 4a and 4b easier and improves assemblability. Moreover, since the thickness of the solder 5 can be made uniform, it is possible to prevent erroneous mounting and reduce a unit price by purchasing products with the same specification.

Fourth Embodiment

Figure 8:
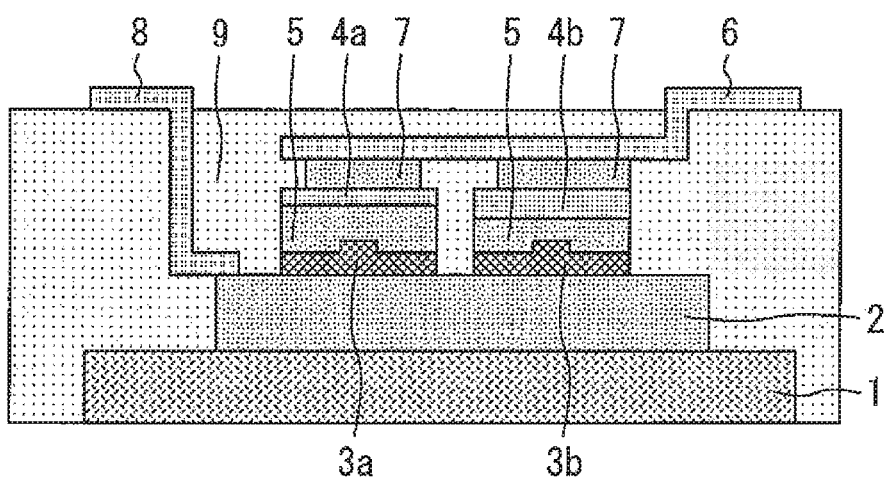
FIG. 8 is a cross-sectional view illustrating a semiconductor device according to a fourth embodiment of the present invention.

FIG. 8 is a cross-sectional view illustrating a semiconductor device according to a fourth embodiment of the present invention. In the present embodiment, the thicknesses of the platings 3a and 3b also change directly below the semiconductor elements 4a and 4b. This makes it possible to increase the thicknesses of the platings 3a and 3b directly below central parts of the semiconductor elements 4a and 4b where deformation increases to thereby suppress the deformation of the semiconductor elements 4a and 4b. Moreover, since the thickness of the solder 5 at those locations can be reduced, thermal resistance decreases.

Figure 9:
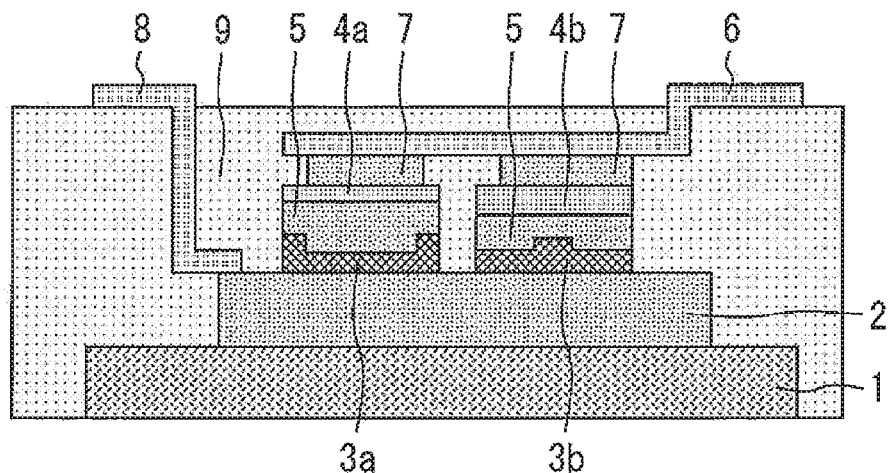
FIG. 9 and FIG. 10 are cross-sectional views illustrating modifications of the semiconductor device according to the fourth embodiment of the present invention.
Figure 10:
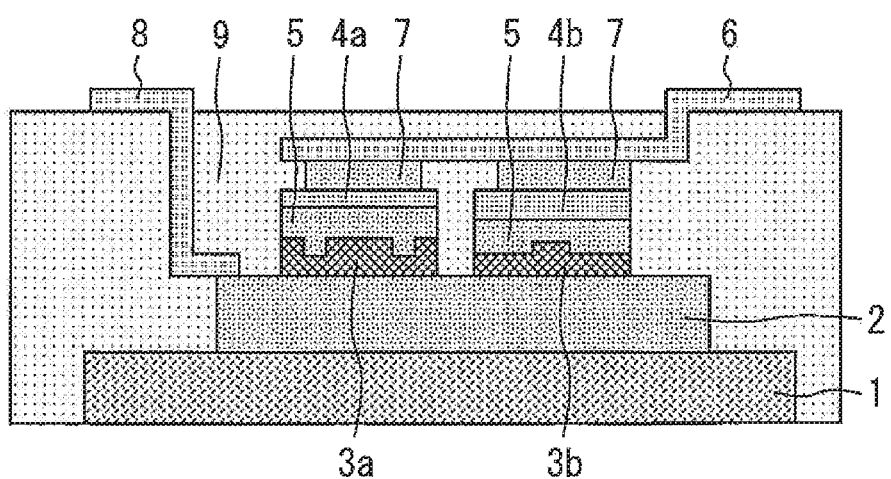

FIG. 9 and FIG. 10 are cross-sectional views illustrating modifications of the semiconductor device according to the fourth embodiment of the present invention. As shown in FIG. 9, the thicknesses of the platings 3a and 3b directly below peripheral parts of the semiconductor elements 4a and 4b may be increased or as shown in FIG. 10, the thicknesses of the platings 3a and 3b directly below central parts and peripheral parts of the semiconductor elements 4a and 4b may be increased. Furthermore, locations where thicknesses are to be increased may be changed for each semiconductor element such as directly below a central part of an IGBT, directly below a peripheral part of the diode.

Fifth Embodiment

Figure 11:
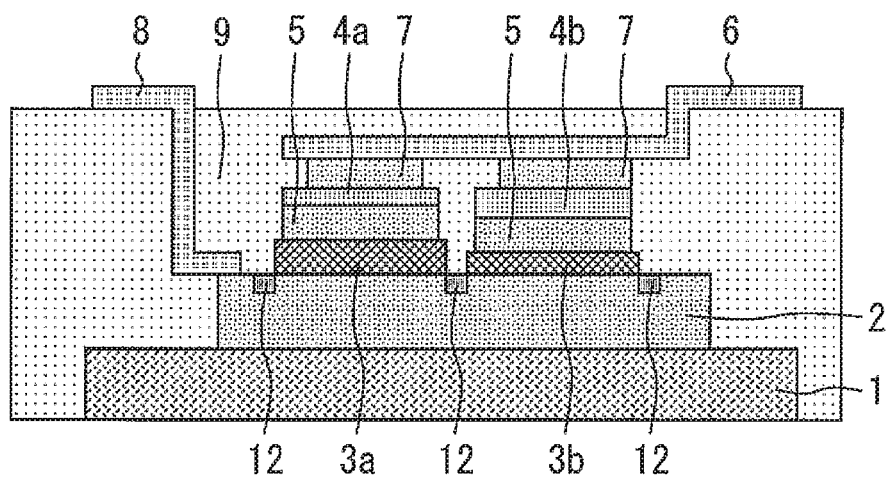
FIG. 11 is a cross-sectional view illustrating a semiconductor device according to a fifth embodiment of the present invention.
Figure 12:
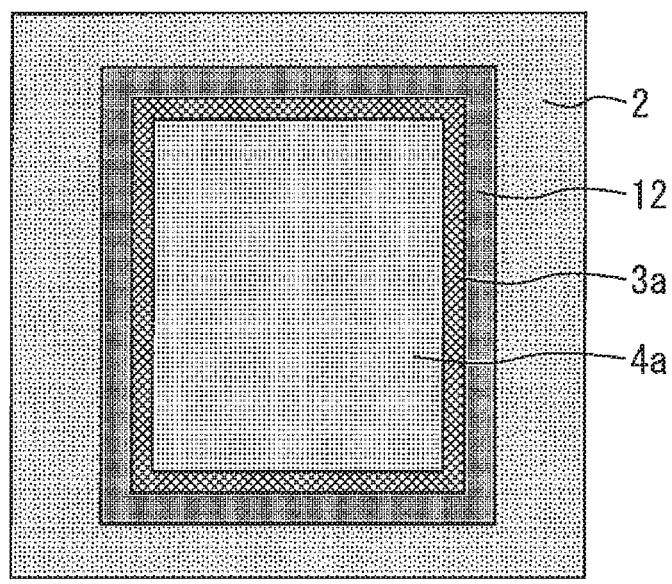
FIG. 12 and FIG. 13 are top views illustrating a partially enlarged view of the semiconductor device according to the fifth embodiment of the present invention.
Figure 13:
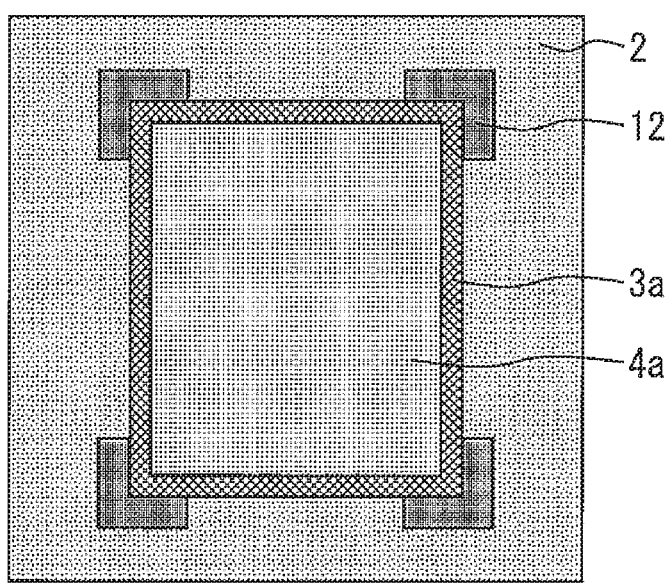

FIG. 11 is a cross-sectional view illustrating a semiconductor device according to a fifth embodiment of the present invention. FIG. 12 and FIG. 13 are top views illustrating a partially enlarged view of the semiconductor device according to the fifth embodiment of the present invention. A groove 12 is provided around each of the semiconductor elements 4a and 4b on the top surface of the aluminum pattern 2. As shown in FIG. 12, the groove 12 may be provided in the entire periphery of each of the semiconductor elements 4a and 4b or as shown in FIG. 13, the grooves 12 may be provided in parts of the periphery. In this way, the groove 12 can suppress deformation from outside the groove 12 of the aluminum pattern 2. Furthermore, the groove 12 can suppress a solder flow and also improve assemblability. Adhesiveness of the sealing material 9 can also be improved.

Figure 14:
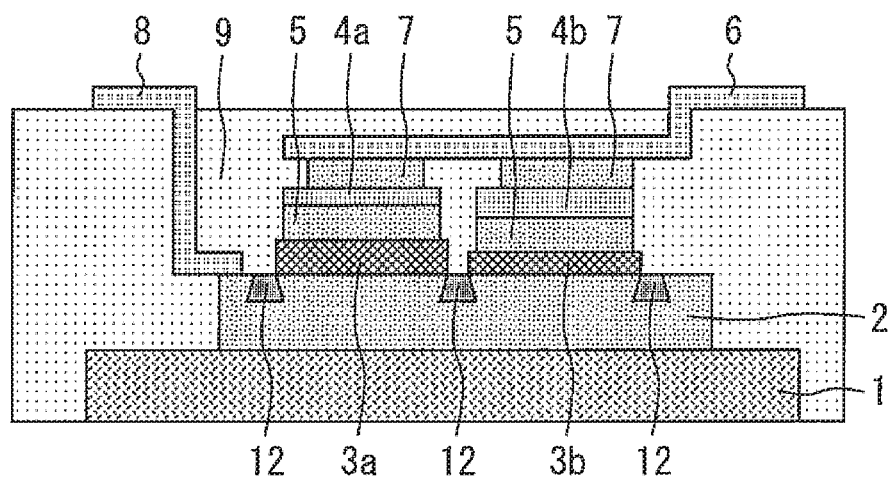
FIGS. 14 to 17 are cross-sectional views illustrating modifications of the semiconductor device according to the fifth embodiment of the present invention.
Figure 15:
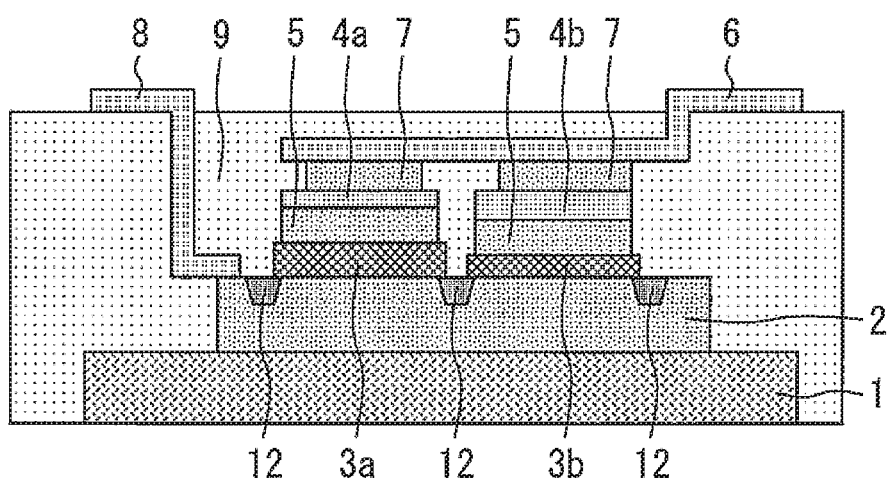
Figure 16:
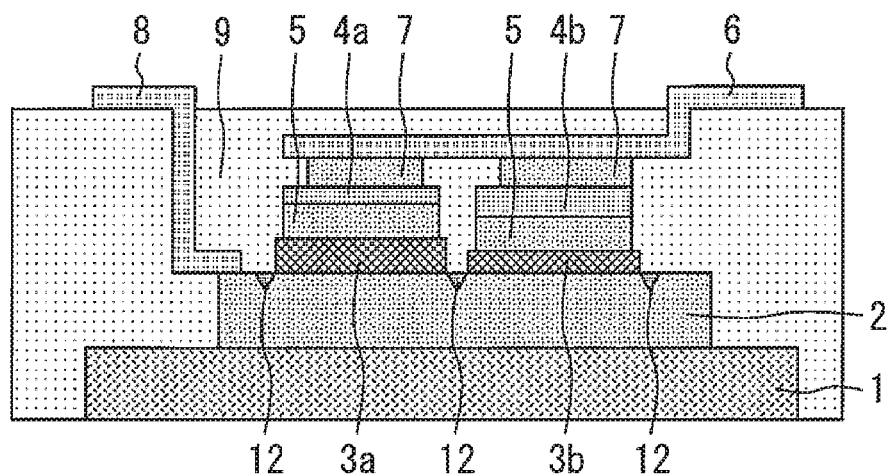
Figure 17:
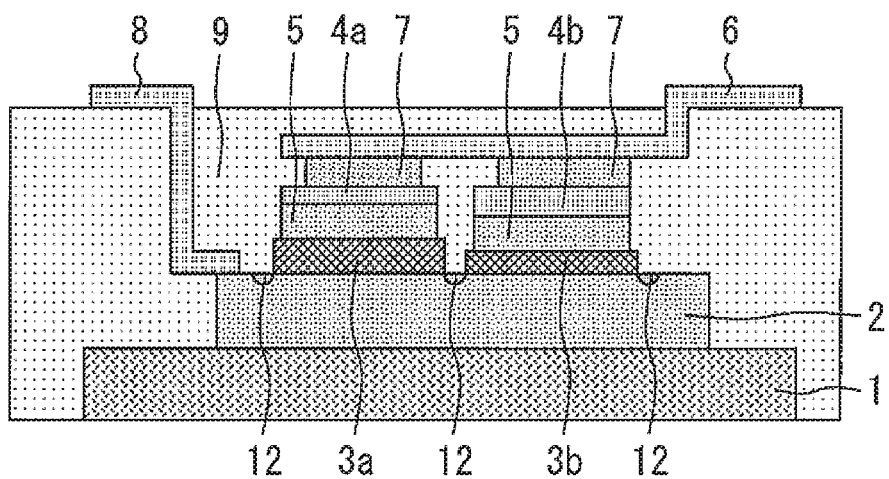

FIGS. 14 to 17 are cross-sectional views illustrating modifications of the semiconductor device according to the fifth embodiment of the present invention. According to FIG. 11, the cross sectional shape of the groove 12 is rectangular or square, but without being limited to this, similar effects can also be obtained if the cross sectional shape is trapezoidal as shown in FIG. 14 and FIG. 15, triangular as shown in FIG. 16 or semicircular as shown in FIG. 17.

Note that the semiconductor elements 4a and 4b are not limited to those formed of silicon, but may also be formed of a wide band gap semiconductor having a wider band gap than silicon. Examples of the wide band gap semiconductor include silicon carbide, nitride gallium-based material or diamond. This prevents deformation of the semiconductor element even when the semiconductor elements 4a and 4b become hot and makes it possible to secure high reliability. Furthermore, since a high withstand voltage and a high maximum allowable current density are obtained, the system can be downsized. Using the downsized semiconductor elements 4a and 4b also allows a semiconductor device into which the semiconductor elements 4a and 4b are assembled to be downsized. Furthermore, since the semiconductor elements 4a and 4b exhibit high heat resistance, it is possible to downsize radiator fins of a heat sink and substitute a water cooling system by an air cooling system, which allows the semiconductor device to be further downsized. Furthermore, since the semiconductor elements 4a and 4b have less power loss and exhibit high efficiency, the semiconductor device can achieve higher efficiency. Both the semiconductor elements 4a and 4b are preferably formed of wide band gap semiconductors, but either one may be formed of a wide band gap semiconductor and it is still possible to obtain the effects described in the present embodiment.

Obviously many modifications and variations of the present invention are possible in the light of the above teachings. It is therefore to be understood that within the scope of the appended claims the invention may be practiced otherwise than as specifically described.

The invention claimed is:

1. A semiconductor device comprising:
    an insulating substrate;
    an aluminum pattern made of a pure aluminum or alloy aluminum material and formed on the insulating substrate;
    a plating formed on a surface of the aluminum pattern; and
    a semiconductor element joined to the plating,
    wherein a thickness of the plating is 10 µm or more,
    the plating includes first and second platings arranged side by side,
    the semiconductor element includes first and second semiconductor elements joined to the first and second platings respectively,
    the first semiconductor element is thinner than the second semiconductor element,
    the first plating is thicker than the second plating, and
    each of the first and second platings has a same material throughout an entire thickness thereof in a direction from the aluminum pattern toward the semiconductor element.

2. The semiconductor device of claim 1, wherein the surface of the aluminum pattern is subjected to total or partial work hardening.

3. The semiconductor device of claim 1, wherein the semiconductor element is formed of a wide band gap semiconductor.

4. The semiconductor device of claim 1, further comprising:
    a first solder layer joining the first semiconductor element to the first plating; and
    a second solder layer joining the second semiconductor element to the second plating.

5. The semiconductor device of claim 1, wherein the same material is nickel.

* * * * *